United States Patent

[11] 3,594,684

[72] Inventor Meryl E. Miller
Palos Verdes Peninsula, Calif.

[21] Appl. No. 823,793
[22] Filed May 12, 1969
[45] Patented July 20, 1971
[73] Assignee Datanetics Corporation
Redondo Beach, Calif.

[54] ELECTRICAL INTERCONNECTION SYSTEM FOR MULTILAYER CIRCUITRY
36 Claims, 5 Drawing Figs.

[52] U.S. Cl. 339/17 LM, 200/159 B, 339/258 R
[51] Int. Cl. H05k 1/04
[50] Field of Search 339/17 M, 17 LM, 17 N, 17 F

[56] References Cited

UNITED STATES PATENTS

| | | | |
|---|---|---|---|
| 2,825,042 | 2/1958 | Tollefson et al. | 339/263 X |
| 3,240,885 | 3/1966 | Grunfelder et al. | 200/5 |
| 2,971,179 | 2/1961 | Heuer | 339/17 LM |
| 3,149,893 | 9/1964 | Dupre | 339/17 LM |

FOREIGN PATENTS

| | | | |
|---|---|---|---|
| 515,373 | 1/1931 | Germany | 339/241 |
| 725,032 | 3/1955 | Great Britain | 339/241 |

*Primary Examiner*—Robert K. Schaefer
*Assistant Examiner*—William J. Smith
*Attorney*—Fulwider, Patton, Rieber, Lee & Utecht

ABSTRACT: A multilayer electrical circuit package wherein interconnections between various thin circuit layers lying in different planes are accomplished by selectively located overlying electrically conductive peripheral contact tabs in the planes of the thin circuit layers, the contact tabs of each layer being spring biased into electrically contacting engagement with the tabs of other layers.

INVENTOR.
MERYL E. MILLER
BY Fulwider, Patton, Rieber
Lee, and Utecht
ATTORNEYS

PATENTED JUL 20 1971

3,594,684

INVENTOR.
MERYL E. MILLER
BY Fulwider Patton Rieber
Lee, and Utecht
ATTORNEYS

ELECTRICAL INTERCONNECTION SYSTEM FOR MULTILAYER CIRCUITRY

BACKGROUND OF THE INVENTION

This invention relates generally to electrical interconnection systems and, more particularly, to a new and improved electrical interconnection system of relatively simple, economical and reliable construction for providing interconnections between various circuit layers in different planes within a multilayer electrical circuit package.

Those concerned with the design and development of microelectronic systems and packages involving multilayer circuit devices, and particularly those dealing with multilayer circuits deposited on very thin substrates, have long been concerned with the problems of providing reliable electrical connections between the circuitry lying in one plane and the circuitry lying in other planes. Typical of the various approaches for accomplishing multilayer interconnections has been the use of plated through holes, nailheads, eyelets, wire forms and the like that are bonded to appropriate conductive land areas in the planes of the various circuit layers to be interconnected. Unfortunately, however, such techniques are not always feasible and, in addition, they increase the complexity and cost of the overall electrical package substantially. Moreover, a number of reliability problems have been encountered, particularly with extremely thin substrates and deposited circuitry, as well as when the electrical package is subjected to relatively high levels of physical stress as in cases of rough handling or vibration.

Other approaches used for making multilayer interconnections utilize specially designed intermediate matrices for performing an interconnection function between circuit layers, riser wire assemblies, edge tab ladder assemblies and the like. Unfortunately, however, these techniques are likewise characterized by relatively high cost and complexity and also tend to reduce the overall packing density of the system.

It will be apparent, therefore, that there has been a long existing need in the electrical art, and particularly in the area of multilayer devices, for a relatively simple, compact, low cost, yet rugged and reliable means for establishing electrical interconnections between various circuit layers in a multilayer electrical circuit package. The present invention clearly fulfills all of these requirements.

SUMMARY OF THE INVENTION

Briefly, and in general terms, the present invention provides a new and improved system for electrically interconnecting layers of electrical circuitry located in different planes within a multilayer electrical assembly. The various layers of electrical circuitry may include thin or thick substrates or a combination thereof, wiring and contact matrices, active or passive components, integrated circuits, etc., in any combination or arrangement without in any way departing from the scope of the invention as regards the interconnection system.

The invention includes a plurality of electrically conductive peripheral contact tabs located in the planes of those circuit layers between which connection is to be made. In some instances, conductive tabs may also be provided in a circuit layer which is not necessarily to be connected to another circuit layer, but is to be used as the medium for establishing a connection between two circuit layers having contact tabs which cannot otherwise be made to overlie each other in direct, electrically conductive engagement, i.e., as where circuit layers to be interconnected are deposited on the same sides of their respective substrates. The peripheral contact tabs in the various planes of electrical circuitry are all located along a common edge of their respective circuit layers, and means are provided for continuously urging the overlying contact tabs of each layer into electrically contacting engagement with the aligned tabs of the other layers to firmly and reliably establish the desired circuitry interconnections.

In a presently preferred embodiment of the electrical interconnection system of the present invention, by way of example and not necessarily by way of limitation, the layers of electrical circuitry are aligned and assembled with their various peripheral contact tabs in proper overlying relation. A multifinger spring clip, extending the full length of the contact tab array, is supported adjacent the resulting contact tab array to urge the various tabs into electrically contacting engagement with each other. The pitch or spacing of the spring clip fingers is selected so that each set of overlying contact tabs is directly biased by at least one spring finger confined to that particular set of tabs. This affords individual spring biasing to each set of aligned contact tabs and avoids the possibility of inadequate or omitted spring bias for any set of tabs which might otherwise occur with a wide single finger spring clip subject to nonuniform spring tension and fatiguing characteristics along its length.

The electrical interconnection system of the present invention provides a relatively simple, relatively inexpensive, yet compact, rugged and reliable structural arrangement for electrically interconnecting selected circuit layers lying in different planes of a multilayer electrical assembly.

The above and other objects and advantages of the invention will be better understood by reference to the following more detailed description, when considered in connection with the accompanying drawings of an illustrative embodiment.

DESCRIPTION OF THE PREFERRED EMBODIMENT

Figure 1:
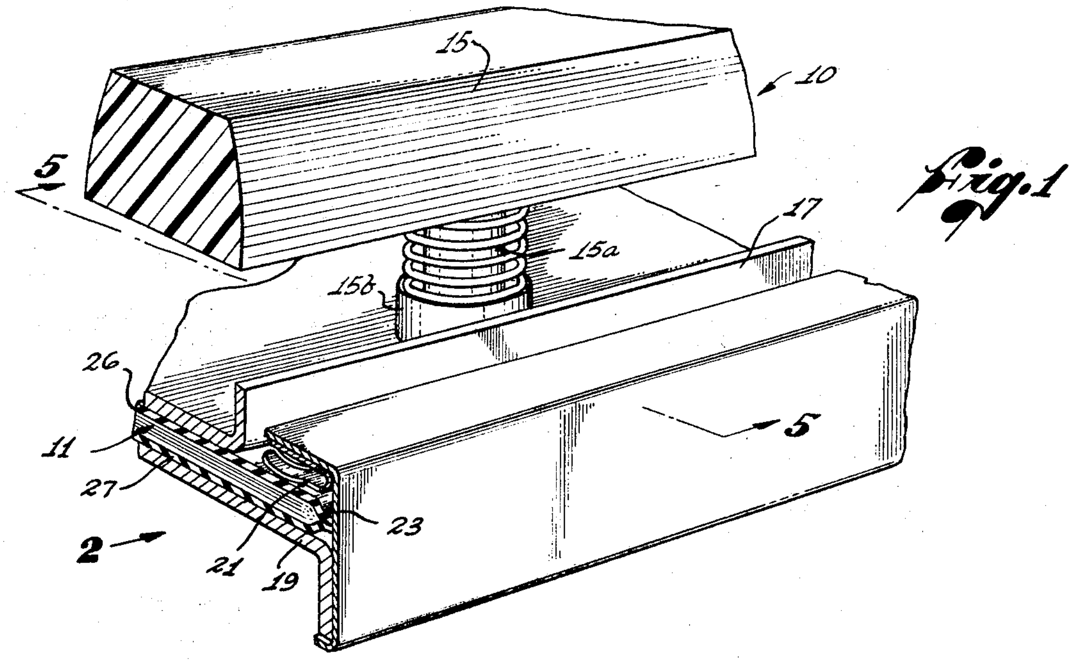
FIG. 1 is a partial, perspective view of an electronic keyboard utilizing the electrical interconnection system of the present invention for its multilayer circuitry, portions being shown in section.
Figure 2:
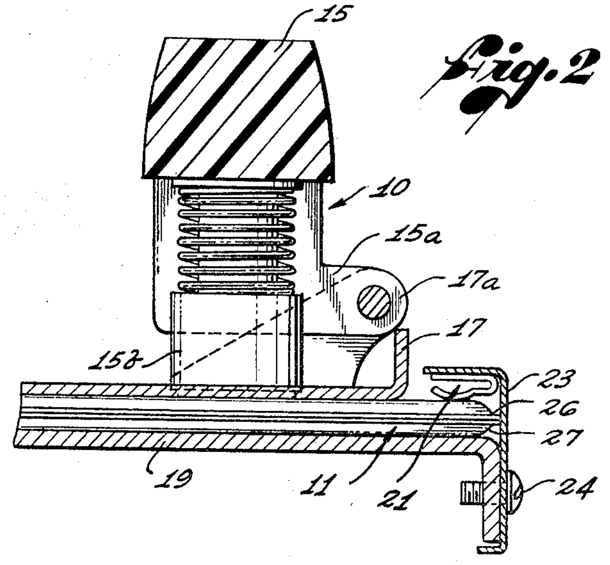
FIG. 2 is an end elevational view, with portions shown in section, of the device shown in FIG. 1.

Referring now to the drawings, and particularly to FIGS. 1 and 2 thereof, there is shown an electronic keyboard, designated generally by the reference numeral 10, including an electrical package, designated generally by the reference numeral 11, the electrical package embodying multilayer electrical circuitry which includes the novel electrical interconnection system of the present invention. Although the invention is particularly described in connection with a keyboard-switching device, it is to be understood that its use is not so limited, and it may also be used for providing electrical interconnections in multilayer circuitry embodied by other types of electrical apparatus.

The keyboard 10 includes a data key assembly 15 which is pressure actuated to cause electrical switching to occur within the electrical package 11. The key assembly 15 is appropriately mounted upon a base plate 17 directly above the electrical package 11. By way of example, and as best observed in FIG. 2, the key assembly 15 is mounted upon the base plate 17 by means of a mounting flange 15*a* of the key assembly attached to a suitable lug 17*a* extending from the base plate 17.

The electrical package 11 is supported between the base plate 17 and a chassis plate 19. In this regard, it will be noted that the proximal end of the electrical package 11 in FIG. 1 extends beyond the end of the base plate 17 while still remaining in overlying engagement with the chassis plate 19.

A spring clip 21 is superposed in contacting relation with the projecting end of the electrical package 11 and is held in position adjacent the electrical package by means of a channel clamp 23 which may be secured in any appropriate manner, as by a screw 24, to the chassis plate 19.

Figure 5:
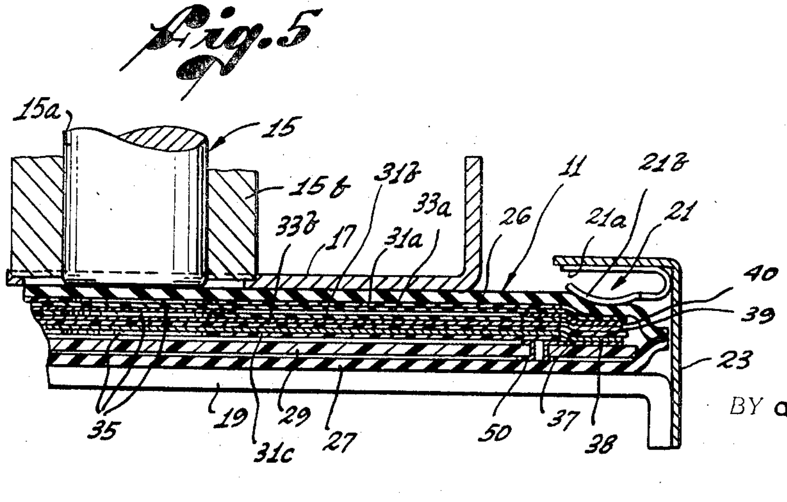
FIG. 5 is a fragmentary, sectional view taken substantially along the line 5–5 in FIG. 1.
Figure 3:
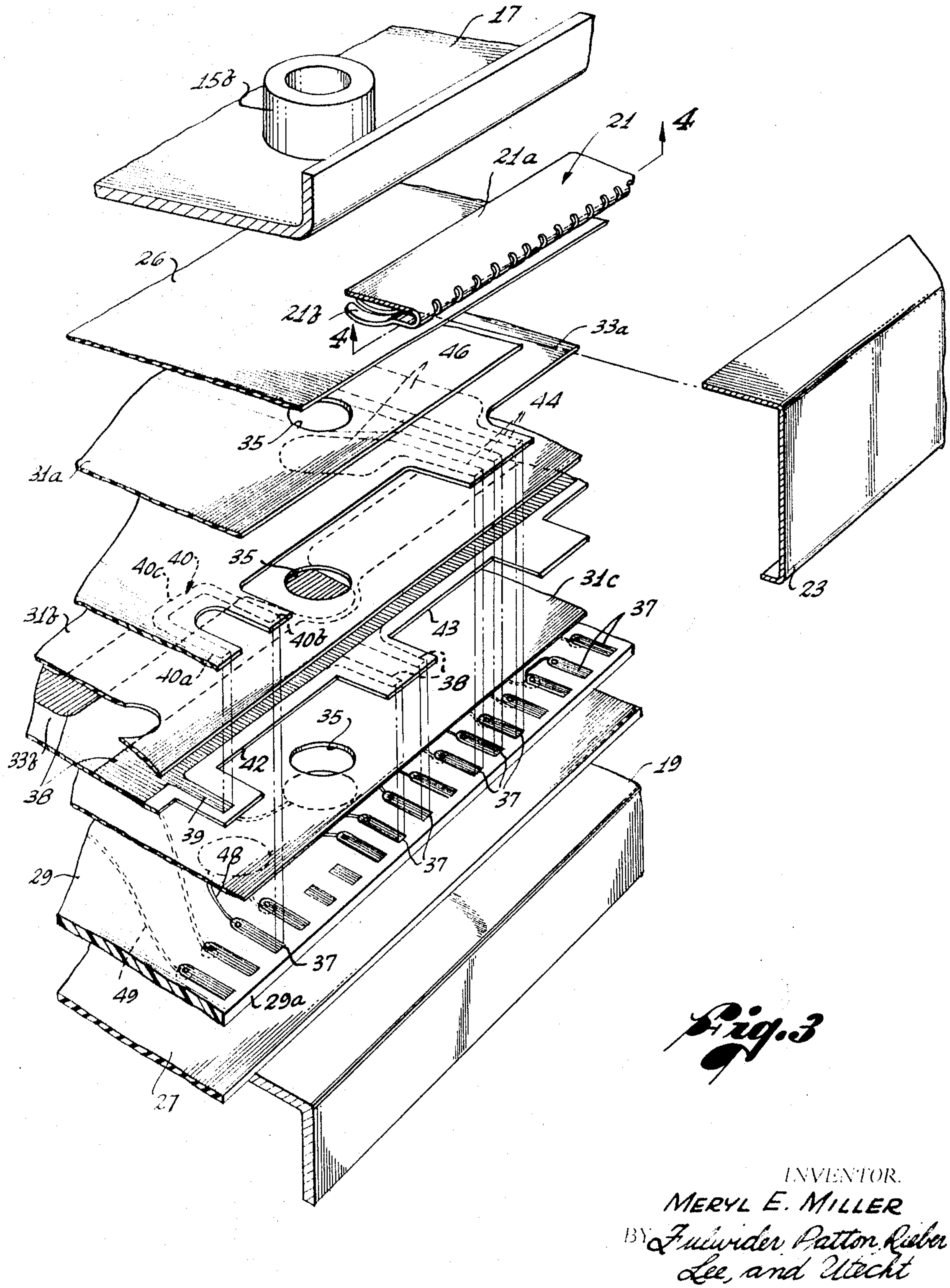
FIG. 3 is a partial, exploded perspective view of the device shown in FIG. 1.

As best observed in FIGS. 3 and 5, the electrical package 11 contains multilayer circuitry between a pair of upper and lower cover sheets 26, 27, respectively. The multilayer circuitry of the electrical package 11 typically includes an etched circuit board 29 in a sandwich subassembly structure including a plurality of insulating sheets 31*a*, 31*b*, 31*c* and thin substrates 33*a*, 33*b* upon which conductive electrical circuit patterns have been appropriately deposited.

The insulating sheets 31*a*, 31*b*, 31*c* are typically of thin polyester film such as Mylar, manufactured by E. I. duPont de Nemours & Co., Inc., and the substrates 33*a*, 33*b* may likewise consist of a thin polyester film base of Mylar or the like upon which electrical circuitry has been plated, etched or the like.

The insulating sheets 31*a*, 31*b*, 31*c* have aligned apertures, such as the apertures 35, in selected locations so that pressure actuation by a selected data key 15 (FIGS. 1, 2, 5) will bring about electrical contact between various of the layers of circuitry deposited upon the substrates 33*a*, 33*b* and the circuitry of the circuit board 29. As best observed in FIG. 5, the latter switching is accomplished by a key plunger 15*a* sliding in an appropriate guide sleeve 15*b*.

Referring now more particularly to FIG. 3, the circuit board 29 includes a plurality of electrically conductive contact tabs 37 deposited upon its upper face in a linear, spaced array closely adjacent the front end 29*a* of the circuit board. These contact tabs 37 are adapted to cooperate with other peripheral contact tabs, in the manner hereinafter described, to accomplish electrical interconnections between various layers of circuitry.

The substrates 33*a*, 33*b* are very thin, flexible sheets, typically 0.003—0.005 inches thick, and the electrical circuitry deposited on the substrates is typically only 5—10 microinches thick. Hence, plated holes and the like to connect circuitry in one plane with circuitry in another plane is impractical, aside from the cost, complexity and reliability factors.

In accordance with the invention, each of the substrates 33*a*, 33*b* is provided with a plurality of electrically conductive, peripheral contact tabs adjacent the respective front ends of the substrates overlying the front end 29*a* of the circuit board 29, to enable electrical interconnections between the various circuit layers.

The substrate 33*b* is provided with plated circuitry on both the top and bottom sides, such as the circuit patterns 38 shown on the top side of the substrate.

The circuitry on the bottom side of the substrate 33*b* terminates in appropriate peripheral contact tabs 38 shown dotted in FIG. 3. These electrically conductive contact tabs 38 on the underside of the substrate 33*b* are in registry with the contact tabs 37 directly below them on the circuit board 29.

Similarly, the circuitry 38 on the top side of the substrate 33*b* terminates in an appropriate peripheral contact tab 39. However, the contact tab 39 cannot directly engage any of the circuit board contact tabs 37 because of the intervening insulating material of the substrate 33*b*. Therefore, electrical connections between the contact tab 39 and one of the contact tabs 37 is accomplished by means of a bypass contact tab 40 plated upon the underside of the upper substrate 33*a*.

The bypass tab 40 includes a pair of spaced apart peripheral contact tabs 40*a* and 40*b* electrically connected together by a plated jumper section 40*c* on the underside of the substrate 33*a*. The contact tab 40*a* directly overlies and is in registry with the contact tab 39 on the upper surface of the substrate 33*b*, whereas the contact tab 40*b* directly overlies and is in registry with one of the contact tabs 37 on the upper surface of the circuit board 29.

In order to enable electrical contact, upon assembly, between the contact tab 40*b* and the contact tab 37, a portion of the insulating substrate 33*b* below the contact tab 40*b* is removed, as at the area designated 42. Similarly, a portion of the substrate 33*b* is removed at the area designated 43 to enable a plurality of peripheral contact tabs 44 plated on the underside of the substrate 33*a* to engage the contact tabs 37 of the circuit board 29 and thereby connect various circuitry 46 plated on the underside of the substrate 33*a* to the circuit board.

The circuit board 29 may include electrical circuitry upon both its top and bottom surfaces, e.g., the circuitry 48 on the top surface and the circuitry 49 on the bottom surface of the circuit board. Since the circuit board 29 is relatively thick, as compared with the thin substrate 33*a* and 33*b*, a plated hole or eyelet 50 (FIG. 5) may be utilized, if desired, to accomplish interconnections between the circuitry on opposite sides of the board.

The multilayer sandwich comprising the various insulating sheets, plated substrates and printed circuit board are aligned and assembled with their various peripheral contact tabs in proper overlying relation and, as best observed in FIGS. 1, 2 and 5, the upper and lower cover sheets 26, 27 are sealed along all of their peripheral edges to define a protective casing. In this regard, the cover sheets 26, 27 are preferably fabricated of an elastomeric material, such as silicone rubber or the like.

Referring now more particularly to FIG. 5, the electrical package 11 is mounted between the keyboard base plate 17 and the chassis plate 19, followed by installation of the spring clip 21 above the package, the clip being held in a compressed state by the channel clamp 23 so that all of the various contact tabs 37, 38, 39, 40 and 44 are forced into appropriate electrically contacting engagement inside the end of the electrical package directly below the spring clip.

Figure 4:
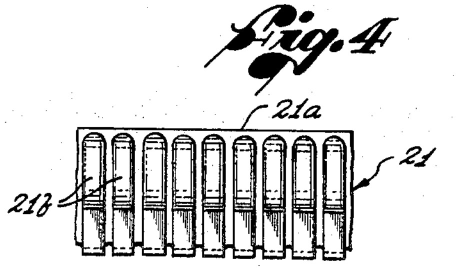
FIG. 4 is a partial, bottom plan view of the spring contact strip used in a presently preferred embodiment of the invention, the view being taken substantially along the line 4–4 in FIG. 3.

As best observed in FIGS. 3 and 4, the clip 21 is formed of a continuous strip of spring material, such as a suitable spring metal or the like. The clip 21 is of substantially U-shaped cross section and extends the full length of the contact tab array along the edge of the electrical package 11. The clip 21 includes a substantially planar, unbroken upper leg 21*a* adapted to engage the channel clamp 23, whereas the bottom leg of the clip is divided along its length into a plurality of slender, spring biasing fingers 21*b*. The width of the fingers 21*b* and spacing between the fingers is selected so that every set of aligned contact tabs in the electrical package 11 below the clip 21 is directly biased into contacting engagement by at least one spring finger confined solely to that particular set of tabs. The net result of such a structural arrangement is to achieve the effect of a separate spring for biasing each set of aligned contact tabs, while simultaneously obtaining the benefit of using a single, relatively simple and inexpensively fabricated member in the form of the clip 21.

The new and improved electrical interconnection system of the present invention is characterized by relatively simple construction, low cost, compactness and high reliability in effectively establishing desired circuit interconnections between electrical circuitry located in different planes within a multilayer electrical assembly.

It will be apparent from the foregoing that, while particular forms of the invention have been illustrated and described, various modifications can be made without departing from the spirit and scope of the invention.

I claim:

1. In a multilayer electrical circuit device, an electrical interconnection system, comprising:

at least one electrically conductive contact tab located in a first plane;

at least one electrically conductive contact tab located in a second plane, both of said contact tabs being located in registry with each other;

a flexible outer casing, both of said contact tabs being contained within said casing; and means for spring biasing both of said tabs into electrically contacting engagement, said means being external to said casing.

2. A system as set forth in claim 1, and further comprising:

an insulating member located in a third plane between said first plane and said second plane, a portion of said member being removed to enable electrically contacting engagement between said contact tabs.

3. In a multilayer electrical circuit device, the combination comprising:

a first electrically conductive contact tab supported in a first plane upon a flexible substrate layer;

a second electrically conductive contact tab supported in a second plane upon a substrate layer, said second tab being in registry with said first tab;

a flexible outer casing, all of said contact tabs and said substrate layers being contained within said casing; and biasing means for continuously urging said first tab and said second tab into electrically contacting engagement, said biasing means being external to said casing.

4. A combination as set forth in claim 3, wherein said biasing means is a spring clip.

5. A combination as set forth in claim 3, and further comprising:

an insulating member located in a third plane between said first plane and said second plane, a portion of said member being removed to enable electrically contacting engagement between said first tab and said second tab.

6. A combination as set forth in claim 5, wherein a portion of said flexible substrate layer supporting said first tab is removed to enable electrically contacting engagement between said fourth tab and said sixth tab.

7. A combination as set forth in claim 5, wherein said first contact tab and said third contact tab are supported on opposite sides of the same substrate layer.

8. A combination as set forth in claim 5, wherein said biasing means is a multifinger spring clip.

9. A combination as set forth in claim 5, wherein all of said contact tabs and said substrate layers are contained within a flexible outer casing, and said biasing means is external to said casing.

10. A combination as set forth in claim 9, wherein said biasing means includes:

an integral spring clip strip having a plurality of spring biasing fingers.

11. A combination as set forth in claim 10, wherein said spring clip strip includes at least one finger for each set of contact tabs in registry.

12. A combination as set forth in claim 10, wherein said spring clip strip has a substantially U-shaped cross section.

13. Electrical apparatus, comprising:

a first set of electrically conductive contact tabs supported in a first plane upon a first flexible substrate layer, said first set of contact tabs being located adjacent a common peripheral edge of said first substrate layer;

a second set of electrically conductive contact tabs supported in a second plane upon a second substrate layer, said second set of contact tabs being located adjacent a common peripheral edge of said second substrate layer, said second set of tabs including tabs in registry with all of the tabs of said first set;

a flexible outer casing, all of said contact tabs and said substrate layers being contained within said casing; and spring biasing means for continuously urging said tabs in registry into electrically contacting engagement, said biasing means being external to said casing.

14. Apparatus as set forth in claim 13, wherein said biasing means includes:

an integral spring clip strip having a plurality of spring biasing fingers, the number of fingers being at least one for each group of electrically contacting tabs in registry.

15. Electrical apparatus as set forth in claim 14, wherein all of said sets of contact tabs and said substrate layers are contained within a flexible outer casing, and said biasing means is an integral spring clip strip external to said casing and substantially coextensive with said common peripheral edges, said spring clip strip having a plurality of spring biasing fingers, the number of fingers being at least one for each group of electrically contacting tabs in registry.

16. Apparatus as set forth in claim 15, wherein said spring clip strip has a substantially U-shaped cross section.

17. In a multilayer electrical circuit device, the combination comprising:

a first electrically conductive contact tab supported in a first plane upon a flexible substrate layer;

a second electrically conductive contact tab supported in a second plane upon a substrate layer, said second tab being in registry with said first tab;

biasing means for continuously urging said first tab and second tab into electrically contacting engagement;

a third electrically conductive contact tab supported in a third plane upon a flexible substrate;

a fourth electrically conductive contact tab supported in said second plane;

fifth and sixth electrically conductive contact tabs supported in a fourth plane upon a flexible substrate, said fifth tab being in registry with said third tab and said sixth tab being in registry with said fourth tab;

an electrically conductive jumper in said fourth plane connecting said fifth and said sixth tabs together; and said biasing means urges said third tab into electrically contacting engagement with said fifth tab and urges said sixth tab into electrically contacting engagement with said fourth tab, thereby electrically connecting said third contact tab to said fourth contact tab.

18. In a multilayer electrical circuit device, the combination comprising:

a first electrical conductive tab supported in a first plane upon a substrate layer;

a second electrically conductive tab supported in a second plane upon a flexible substrate layer;

third and fourth electrically conductive tabs supported in a third plane upon a flexible substrate layer, said third tab being in registry with said second tab and said fourth tab being in registry with said first tab; and biasing means for continuously urging said third tab into electrically contacting engagement with said second tab and urging said fourth tab into electrically contacting engagement with said first tab.

19. A combination as set forth in claim 8, and further comprising:

an electrically conductive jumper in said third plane connecting said third and said fourth tabs together to thereby electrically connect said first tab to said second tab.

20. A combination as set forth in claim 18, wherein:

a portion of said flexible substrate layer supporting said second tab is removed to enable electrically contacting engagement between said first tab and said fourth tab.

21. A combination as set forth in claim 18, wherein:

said biasing means is a multifinger spring clip having one finger for each set of contact tabs in registry.

22. A combination as set forth in claim 18, and further comprising:

a fifth electrically conductive tab supported in a fourth plane upon a substrate; and a sixth electrically conductive tab supported in said first plane, said fifth tab being in registry with said sixth tab, said biasing means continuously urging said fifth tab into electrically contacting engagement with said sixth tab.

23. A combination as set forth in claim 22, wherein:

said fifth tab and said second tab are supported on opposite sides of the same substrate layer.

24. A combination as set forth in claim 18, and further comprising:

a fifth electrically conductive contact tab supported in said third plane; and a sixth electrically conductive contact tab supported in said first plane, said fifth tab being in registry with said sixth tab, said biasing means continuously urging said fifth tab into electrically contacting engagement with said sixth tab.

25. A combination as set forth in claim 18, wherein all of said contact tabs and said substrate layers are contained within a flexible outer casing, and said biasing means is external to said casing.

26. A combination as set forth in claim 25, wherein: said biasing means is a multifinger spring clip having one finger for each set of contact tabs in registry.

27. Electrical apparatus, comprising:

a first set of electrically conductive contact tabs supported in a first plane upon a first flexible substrate layer, said first set of contact tabs being located adjacent a common peripheral edge of said first substrate layer;

a second set of electrically conductive contact tabs supported in a second plane upon a second substrate layer, said second set of contact tabs being located adjacent a common peripheral edge of said second substrate layer, said second set of tabs including tabs in registry with all of the tabs of said first set;

spring biasing means for continuously urging said tabs in registry into electrically contacting engagement;

a third set of electrically conductive contact tabs supported in a third plane upon said first substrate layer, said third set of contact tabs also being located adjacent said common peripheral edge of said first substrate layer;

a fourth set of electrically conductive contact tabs supported in a fourth plane upon a third substrate layer, said third substrate layer being flexible, said fourth set of contact tabs being located adjacent a common peripheral edge of said third substrate layer, some of said fourth set of contact tabs being in registry with said third set of contact tabs and others of said fourth set of contact tabs being in registry with some of said second set of contact tabs; and electrically conductive jumper means in said fourth plane connecting said some of said fourth set of contact tabs to said others of said fourth set of contact tabs.

28. Electrical apparatus, comprising:

a first set of electrically conductive contact tabs supported in a first plane upon a first substrate layer, said first set of contact tabs being located adjacent a common peripheral edge of said first substrate layer;

a second set of electrically conductive contact tabs supported in a second plane upon a flexible second substrate layer, said second set of contact tabs being located adjacent a common peripheral edge of said second substrate layer;

a third set of electrically conducting contact tabs supported in a third plane upon a flexible third substrate layer, said third set of contact tabs being located adjacent a common peripheral edge of said third substrate layer, some of said third set of contact tabs being in registry with said second set of contact tabs and others of said third set of contact tabs being in registry with some of said first set of contact tabs; and spring biasing means for continuously urging said tabs in registry into electrically contacting engagement.

29. Electrical apparatus as in claim 28, and further comprising:

electrically conductive jumper means in said third plane connecting said some of said third set of contact tabs to said others of said third set of contact tabs.

30. Electrical apparatus as set forth in claim 28, wherein:

all of said sets of contact tabs and said substrate layers are contained within a flexible outer casing, and said biasing means is an integral spring clip strip external to said casing and substantially coextensive with said common peripheral edges, said spring clip strip having a plurality of spring biasing fingers, the number of fingers being at least one for each group of electrically contacting tabs in registry.

31. Electrical apparatus as set forth in claim 29, wherein:

all of said sets of contact tabs and said substrate layers are contained within a flexible outer casing, and said biasing means is an integral spring clip strip external to said casing and substantially coextensive with said common peripheral edges, said spring clip strip having a plurality of spring biasing fingers, the number of fingers being at least one for each group of electrically contacting tabs in registry.

32. Apparatus as set forth in claim 30, wherein:

said spring clip strip has a substantially U-shaped cross section.

33. Apparatus as set forth in claim 31, wherein:

said spring clip strip has a substantially U-shaped cross section.

34. A combination as set forth in claim 4, wherein:

said spring clip has a substantially U-shaped cross section.

35. An electrical circuit device and interconnection therefor, comprising:

a first electrically conductive contact tab supported in a first plane upon one side of a substrate layer, said substrate layer having an opposite side defining a second plane;

a second electrically conductive contact tab supported in a third plane upon a flexible substrate layer, said flexible substrate layer having an opposite side defining a fourth plane;

a third electrically conductive tab supported in said first plane upon said substrate layer supporting said first contact tab;

a fourth electrically conductive contact tab supported in said third plane upon said flexible substrate layer supporting said second contact tab, said fourth contact tab being in registry with said first contact tab and said second contact tab being in registry with said third contact tab;

an insulating member defining fifth and sixth planes, said insulating member being positioned between said substrate and said flexible substrate, said fifth plane confronting said first plane;

biasing means for continuously urging said fourth contact tab into electrically contacting engagement with said first contact tab and urging said second contact tab in electrically contacting engagement with said third contact tab; and electrically conductive jumper means in said third plane connecting said fourth contact tab and said second contact tab.

36. An electrical circuit device and interconnection therefor as set forth in claim 35, wherein:

all of said contact tabs and substrate layers are contained within a flexible outer casing, said biasing means is a multifinger spring clip having one finger for each set of contact tabs in registry, and said multifinger spring clip is external to said casing.

PO-1050
(5/69)

UNITED STATES PATENT OFFICE
CERTIFICATE OF CORRECTION

Patent No. 3,594,684 Dated July 20, 1971

Inventor(s) Meryl E. Miller

It is certified that error appears in the above-identified patent and that said Letters Patent are hereby corrected as shown below:

Column 6, line 44, "claim 8" should read --claim 18--.

Signed and sealed this 15th day of February 1972.

(SEAL)
Attest:

EDWARD M.FLETCHER,JR.
Attesting Officer

ROBERT GOTTSCHALK
Commissioner of Patents